United States Patent
Li

(10) Patent No.: US 8,976,819 B2
(45) Date of Patent: Mar. 10, 2015

(54) CIRCUIT AND METHOD FOR METERING ELECTRICITY

(75) Inventor: Alex Li, Shanghai (CN)

(73) Assignee: STMicroelectronics (China) Investment Co. Ltd, Shanghai (CN)

( * ) Notice: Subject to any disclaimer, the term of this patent is extended or adjusted under 35 U.S.C. 154(b) by 625 days.

(21) Appl. No.: 13/313,605

(22) Filed: Dec. 7, 2011

(65) Prior Publication Data

US 2012/0170598 A1    Jul. 5, 2012

(30) Foreign Application Priority Data

Dec. 31, 2010 (CN) .......................... 2010 1 0624781

(51) Int. Cl.
*H04J 3/02* (2006.01)
*G01R 21/133* (2006.01)

(52) U.S. Cl.
CPC .................... *G01R 21/133* (2013.01)
USPC ...................................................... 370/537

(58) Field of Classification Search
None
See application file for complete search history.

(56) References Cited

U.S. PATENT DOCUMENTS

| | | | |
|---|---|---|---|
| 6,977,494 B2 * | 12/2005 | Ramirez | 324/117 R |
| 8,183,818 B2 * | 5/2012 | Elhalis | 320/101 |
| 2007/0272110 A1 * | 11/2007 | Brent et al. | 102/313 |

FOREIGN PATENT DOCUMENTS

| | | |
|---|---|---|
| CN | 201589801 U | 9/2010 |
| CN | 202093091 U | 12/2011 |
| EP | 1531334 A2 | 5/2005 |
| KR | 20090062508 A | 6/2009 |
| WO | WO-2004051289 A1 | 6/2004 |

OTHER PUBLICATIONS

Chinese First Office Action for CN 201010624781.3 mailed Dec. 30, 2013 (5 pages).

* cited by examiner

*Primary Examiner* — Andrew Lai
*Assistant Examiner* — Leon Andrews
(74) *Attorney, Agent, or Firm* — Gardere Wynne Sewell LLP

(57) ABSTRACT

A current detection module generates a first current detection signal of a first current flowing through a first power line and a second current detection signal of a second current flowing through a second power line. A multiplexer periodically switches between the two current detection signals in response to a control signal so as to output the first current detection signal within a first duration of each cycle of the control signal and the second current detection signal within a second duration of each cycle of the control signal. A signal processing module generates an energy accumulation signal according to the output of the multiplexer and a voltage detection signal of the voltage of a phase line. A control module provides the control signal to the multiplexer, and generates an effective value of the second current during the second duration.

24 Claims, 3 Drawing Sheets

CIRCUIT AND METHOD FOR METERING ELECTRICITY

PRIORITY CLAIM

This application claims priority from Chinese Application for Patent No. 201010624781.3 filed Dec. 31, 2010, the disclosure of which is incorporated by reference.

TECHNICAL FIELD

This invention relates generally to electronic circuits, and more particularly to a circuit and method for metering electricity.

BACKGROUND

An electricity meter is an electrical energy measurement device that accurately measures the amount of electrical energy flowing to consumers from energy suppliers. The amount of electrical energy measured by the electricity meter is then used to determine the electricity bill for which the energy suppliers should charge.

According to some industrial standards or regional standards, a qualified electricity meter should be capable of providing many working parameters, such as an effective value of the current flowing through power lines, either a phase line or a neutral line, an effective value of the voltage on the phase line, and an energy accumulation produced by the corresponding currents. The voltage on the phase line is referring to a voltage difference between the phase line and a reference potential such as ground or the neutral line. Specially, for electricity meters having anti-tamper function, it is generally required to monitor both the current in the phase line and the current in the neutral line simultaneously. When a big difference between the two currents is detected, the electricity meter could give a warning signal to indicate that the electricity is not properly used.

One approach has been used to simultaneously monitor the currents in the phase line and the neutral line by means of two detection channels, each of which comprises a current detector and an analog to digital converter (ADC). In this approach, the current in the phase line is detected by one detection channel, and the current in the neutral line is detected by the other detection channel. Specifically, the current detector is configured to sample the currents and generate current detection signals of the respective power lines. The A/D converter of each detection channel is configured to convert the current detection signal to a digital signal, which is further provided to a signal processing module. The A/D converters can be sigma-delta converters with high resolution. However, two A/D converters require more chip area, and therefore lead to higher power consumption and cost.

SUMMARY

An approach that has been used to monitor two currents in the phase line and the neutral line comprises a circuit having two current detection channels. The current detection channels are periodically multiplexed, by a multiplexer, to provide the circuit with a single time division multiplexing input signal, which is further converted to a digital signal by a single A/D converter. The multiplexing of the two current detection channels is under the control of a control module, for example, a microprocessor control unit. Therefore, the value of the currents in the phase line and the neutral line can be respectively detected in different durations. Moreover, the effective value of the currents can be calculated from values of the currents according to specific algorithms. For most conventional solutions, the effective value is calculated according to values of the currents in a period. However, when there is a significant difference between the currents flowing through the phase line and the neutral line, the switching between the two current detection channels will need a long settle time for the signals, which will adversely affect the accuracy of the measurement.

Thus, there is a need for a circuit and method for metering electricity more accurately, especially with a smaller settle time for signals.

In an embodiment, a circuit comprises a current detection module, a multiplexer, a signal processing module and a control module. The current detection module is configured to generate a first current detection signal of a first current flowing through a first power line, and a second current detection signal of a second current flowing through a second power line, wherein one of the power lines is a phase line. The multiplexer is configured to periodically switch between the two current detection signals in response to a control signal, and to output the first current detection signal within a first duration of each cycle and the second current detection signal within a second duration of each cycle. The signal processing module is configured to generate an energy accumulation signal according to the output of the multiplexer and a voltage detection signal of the voltage of the phase line. The control module is configured to provide the control signal to the multiplexer, and to generate an effective value, which is given by $$\frac{\Delta E}{\Delta T \cdot U},$$

of the second current during the second duration, wherein $\Delta E/\Delta T$ denotes a change rate of the energy accumulation signal, and U denotes an effective value of the voltage of the phase line.

In another embodiment, an electricity meter comprises a current detection module, a multiplexer, a signal processing module and a control module. The current detection module is configured to generate a first current detection signal of a first current flowing through a first power line, and a second current detection signal of a second current flowing through a second power line, wherein one of the power lines is a phase line. The multiplexer is configured to periodically switch between the two current detection signals in response to a control signal, and to output the first current detection signal within a first duration of each cycle and the second current detection signal within a second duration of each cycle. The signal processing module is configured to generate a energy accumulation signal according to the output of the multiplexer and a voltage detection signal of the voltage of the phase line. The control module is configured to provide the control signal to the multiplexer, and to generate an effective value, which is given by $$\frac{\Delta E}{\Delta T \cdot U},$$

of the second current during the second duration, wherein $\Delta E/\Delta T$ denotes a change rate of the energy accumulation signal, and U denotes an effective value of the voltage of the phase line.

In a further embodiment, a method comprises the steps of: detecting a first current flowing through a first power line and a second current flowing through a second power line, wherein one of the power lines is a phase line, and generating a current detection signal periodically associated with the first current within a first duration of each cycle and associated with the second current within a second duration of each cycle; providing a voltage detection signal and an effective value of the voltage of the phase line; generating an energy accumulation signal according to the current detection signal and the voltage detection signal; and generating an effective value, which is given by $$\frac{\Delta E}{\Delta T \cdot U},$$

of the second current during the second duration, wherein ΔE/ΔT denotes a change rate of the energy accumulation signal, and U denotes the effective value of the voltage of the phase line.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different Figures generally refer to corresponding parts unless otherwise indicated. The Figures are drawn to clearly illustrate the relevant aspects of embodiments of the present disclosure and are not necessarily drawn to scale. To more clearly illustrate certain embodiments, a letter indicating variations of the same structure, material, or process step may follow a Figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 1:
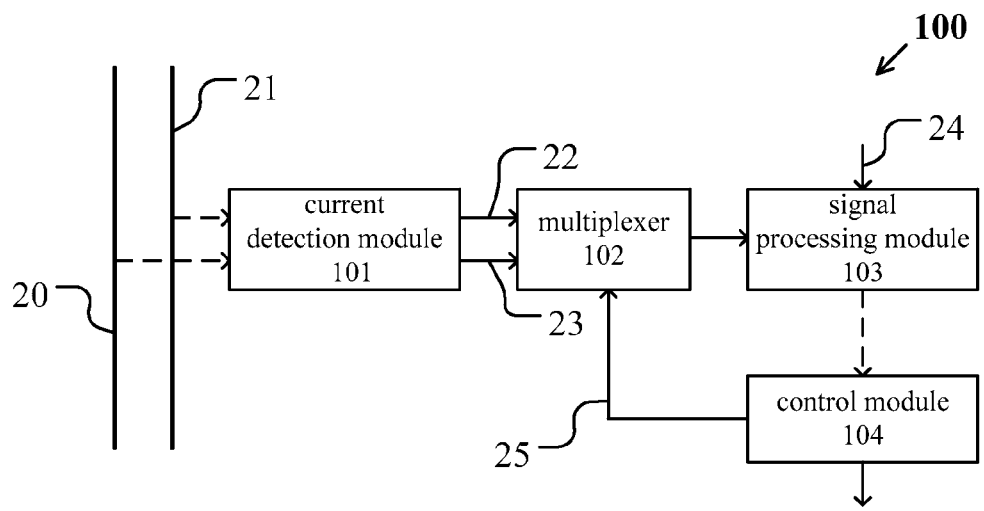
FIG. 1 illustrates a circuit according to an embodiment of the present invention.

FIG. 1 illustrates a circuit 100 according to an embodiment. The circuit 100 can be used to, for example, meter electricity. The circuit 100 comprises a current detection module 101, a multiplexer 102, a signal processing module 103 and a control module 104.

The current detection module 101 is configured to generate a first current detection signal 23 of a first current flowing through a first power line 20, and to generate a second current detection signal 22 of a second current flowing through a second power line 21, wherein one of the power lines is a phase line. In an embodiment, the first power line 20 can be the phase line and the second power line 21 can be a neutral line. In another embodiment, the first power line 20 can be a neutral line and the second power line 21 can be the phase line. The current detection module 101 has two detection channels, each of which has a current detection device configured to sample the current. The current detection device 101 can be, for example, a current transformer. The current detection signals proportionally change with the respective currents, and therefore the first and second currents can be accurately sampled.

Figure 2:
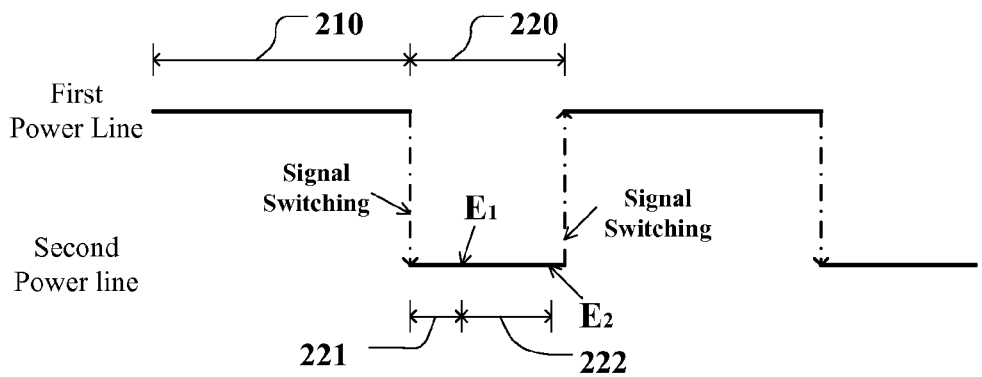
FIG. 2 illustrates an exemplary calculation of the change rate of the instantaneous energy accumulation signal according to an embodiment of the present invention.

The multiplexer 102 is configured to periodically switch between the two current detection signals in response to a control signal 25. Each cycle of the control signal comprises two durations, that is, a first duration and a second duration. The multiplexer 102 outputs the first current detection signal 23 within the first duration of each cycle, e.g. the duration 210 as shown in FIG. 2, and outputs the second current detection signal 22 within the second duration of each cycle, e.g. the duration 220 as shown in FIG. 2. By using the multiplexer 102, the circuit 100 according to the embodiment can monitor currents in both power lines with only one A/D converter. Thus, the circuit 100 can significantly reduce power consumption and cost.

The signal processing module 103 is configured to generate a energy accumulation signal according to a voltage detection signal 24 of the voltage of the phase line, and the output of the multiplexer 102, that is, a first current detection signal 23 or a second current detection signal 22. The voltage detection signal 24 changes with the voltage of the phase line. It is appreciated that, the energy accumulation signal can be calculated from the voltage detection signal 24 and the current detection signals 22, 23, and therefore the energy accumulation signal can substantially follow the change of the voltage detection signal 24 and the current detection signals 22, 23. According to different algorithms of the calculation, the energy accumulation signal may have a time delay with respect to the voltage detection signal 24 and the current detection signals 22, 23, for example, one or more cycles of the signal processing. The voltage of the phase line refers to a voltage difference between the phase line and a reference potential, such as ground or the neutral line. In this embodiment, the reference potential can be the voltage on the neutral line, and then the voltage detection signal 24 proportionally changes with the voltage difference between the power lines 20, 21, which can be generated by a voltage detection module coupled to the power lines 20, 21. Preferably, the signal processing module 103 also generates an effective value of the voltage of the phase line according to the voltage detection signal 24.

The control module 104 is configured to provide the control signal 25 to the multiplexer 102, and to generate an effective value, which is given by $$\frac{\Delta E}{\Delta T \cdot U},$$

of the second current during the second duration, wherein ΔE/ΔT denotes a change rate of the instantaneous energy accumulation signal, and U denotes an effective value of the voltage of the phase line. To be specific, the change rate of the energy accumulation signal is calculated according to the energy accumulation signal generated by the signal processing module 103. Preferably, the circuit 100 further comprises a register configured to store the energy accumulation signal, which can be provided to the control module 104 in response to requests from the control module 104.

Hereinafter, the working of the circuit 100 shown in FIG. 1 will be elaborated.

Still referring to FIG. 1, the circuit 100 is coupled to the first power line 20 and the second power line 21, and configured to meter electricity flowing through the power lines, especially to measure the effective value of the currents flowing therethrough.

As mentioned above, in response to the control signal 25 generated by the control module 104, the multiplexer 102 periodically outputs the first and second current detection signals.

In the first duration 210, the multiplexer 102 provides the first current detection signal 23, which reflects the variation of the first current, to the signal processing module 103. To be specific, since the first current flowing through the phase line 20 is substantially stable and continuous, the signal processing module 103 can calculate the effective value of the first current directly according to the first current detection signal 23. For example, the effective value of the first current is given by the following equation:

$$I_{\mathit{eff}} = \sqrt{\frac{1}{T}\int_0^T I_m^2(t)\,dt};$$

wherein $I_{\mathit{eff}}$ denotes the effective value of the first current, T denotes a sampling time for calculating the effective value of the first current, $I_m$ denotes the value of the first current (i.e., the value of the first current at each time within the sampling period). It should be noted that, the current detection signals are analog signals. As a result, the signal processing module 103 may convert them to digital signals first, and then calculate the effective value of the respective current.

When the first duration 210 is over, the control module 104 generates a control signal 25 that requests the multiplexer 102 to switch to the second current detection signal 22, which reflects the variation of the second current, for a second duration 220.

In the second duration 220, the control module 104 generates the effective value of the second current according to the change rate of the energy accumulation signal and the effective value of the voltage of the phase line, instead of directly using the second current detection signal. In an embodiment, the change rate of the energy accumulation signal is calculated once in a second duration 220, and then the effective value of the second current maintains the same in the second duration 220. In another embodiment, the change rate of the energy accumulation signal can be calculated more than one time in a second duration 220, and then the effective value of the second current changes in the second duration 220. Alternatively, the effective value of the first current can be generated in the same manner as the effective value of the second current as mentioned above.

FIG. 2 illustrates an exemplary calculation of the change rate of the energy accumulation signal according to an embodiment of the present invention.

As shown in FIG. 2, the change rate of the energy accumulation signal is calculated after a first interval 221 since the beginning of the second duration 220 of each cycle. For example, after a first interval 221 since the beginning of the second duration 220, the control module records a first value $E_1$ of the energy accumulation signal. Then after a second interval 222 since the end of the first interval 221, the control module records a second value $E_2$ of the energy accumulation signal. Therefore, the change rate of the energy accumulation signal can be given by $(E_1-E_2)/T_0$, wherein $T_0$ denotes the value of the second interval 222. In an embodiment, the energy accumulation signal is a definite integration of the product of the current detection signal and the voltage detection signal, that is, an energy accumulation that has been consumed.

When calculating the change rate of the energy accumulation signal, the control module 104 also defines an effective value U of the voltage of the phase line. Then the effective value of the second current during the second duration can be given by $$\frac{\Delta E}{\Delta T \cdot U}.$$

In an embodiment, the effective value U of the voltage of the phase line is assumed a constant value during the second duration 220.

As described above, in the second duration 220, the effective value of the second current is generated by the circuit 100 according to the value of the second current that corresponds to the current detection signal at a given time within the second duration 220, instead of a series of values of the continuously changing first or second current in a period. As a result, the value of the first current measured in the first duration 210 will not affect the effective value of the second current. Assuming the second current is significantly different from the first current at the switching moment, accordingly the output of the multiplexer will change greatly. Under this condition, the effective value of the second current generated according to the embodiment can be more accurate than conventional solutions. Furthermore, the measurement of the second current in the second duration can therefore be reduced to a significantly smaller period, for example, 200 milliseconds or less.

When the effective value of the second current has been generated, the control module 104 provides the control signal 25 that requests the multiplexer 102 to switch to the first current detection signal again, and then a measuring cycle for metering electricity has finished.

In an embodiment, the first power line 20 is the phase line and the second power line 21 is the neutral line. The first current detection signal 23 of the first current can be used to determine the power or energy consumption, while the second current detection signal 22 of the second current can be used to determine whether there is a fault, such as tamper or electric leakage. Therefore, the first duration 210 is generally longer than the second duration 220. In an embodiment, the second duration 220 is not greater than 400 milliseconds. Accordingly, each cycle for metering electricity can be, for example, 1 to 20 seconds. In another embodiment, the first interval 221 of the second duration 220 is not greater than 100 milliseconds. In a further embodiment, the second interval 222 of the second duration 220 is within a range from 20 milliseconds to 200 milliseconds.

Figure 3:
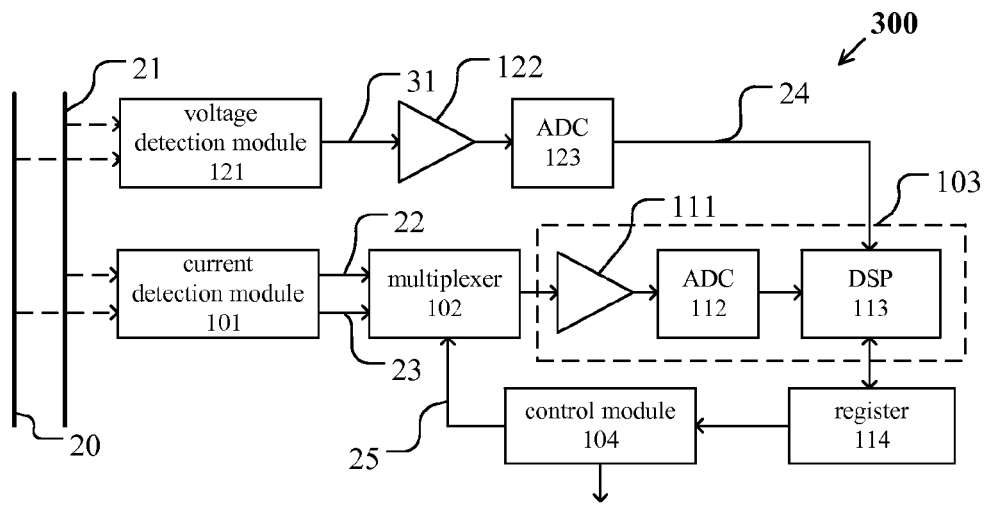
FIG. 3 illustrates a circuit according to another embodiment of the present invention.

FIG. 3 illustrates a circuit 300 according to another embodiment. The circuit 300 can be used to, for example, meter electricity.

As shown in FIG. 3, the circuit 300 comprises a current detection module 101, a multiplexer 102, a signal processing module 103, a control module 104, a register 114 and a voltage detection module 121.

The current detection module 101 is configured to generate a first current detection signal 23 of a first current flowing through a first power line 20, and to generate a second current detection signal 22 of a second current flowing through a second power line 21, wherein one of the power lines is a phase line.

The multiplexer 102 is configured to periodically switch between the two current detection signals in response to a control signal 25.

The signal processing module 103 is configured to generate an energy accumulation signal according to a voltage detection signal 24 of the voltage of the phase line, and the first or second current detection signal.

In specific, the signal processing module 103 comprises a first amplifier 111, a first A/D converter 112, and a digital signal processing (abbreviated for DSP) module 113. The first amplifier 111 is configured to receive the output of the multiplexer 102, that is, the first current detection signal 23 or the second current detection signal 22. The first A/D converter 112 is configured to convert the current detection signals provided by the first amplifier 111 to digital signals. The DSP module 113 is configured to implement the processing, for example, calculating, of received digital signals, and to generate the energy accumulation signal. In an embodiment, the DSP module 113 is further configured to generate an effective value of the voltage of the phase line according to the voltage detection signal 24.

In a preferred embodiment, the circuit 300 further comprises the register 114, which is configured to store respective values of digital signals, for example, the energy accumulation signal and the effective value of the voltage of the phase line. These digital signals can be provided to the control module 104.

It will be appreciated that in a variation of the circuit 300, the register 114 can be an internal component of the signal processing module 103.

The control module 104 is configured to provide the control signal 25 to the multiplexer 102, and to generate an effective value, which is given by $$\frac{\Delta E}{\Delta T \cdot U},$$

of the second current during the second duration, wherein ΔE/ΔT denotes a change rate of the energy accumulation signal, and U denotes the effective value of the voltage of the phase line.

The voltage detection module 121 is configured to generate the voltage detection signal 31. The voltage detection signal 31 proportionally changes with the voltage of the phase line, and is further provided to a second amplifier 122. The voltage detection signal 31 is amplified by the second amplifier 122, and further converted to a digital signal of the voltage of the phase line by a second A/D converter 123. Therefore, the digital signal generated by the second A/D converter 123 can be provided to the DSP module 113.

Figure 4:
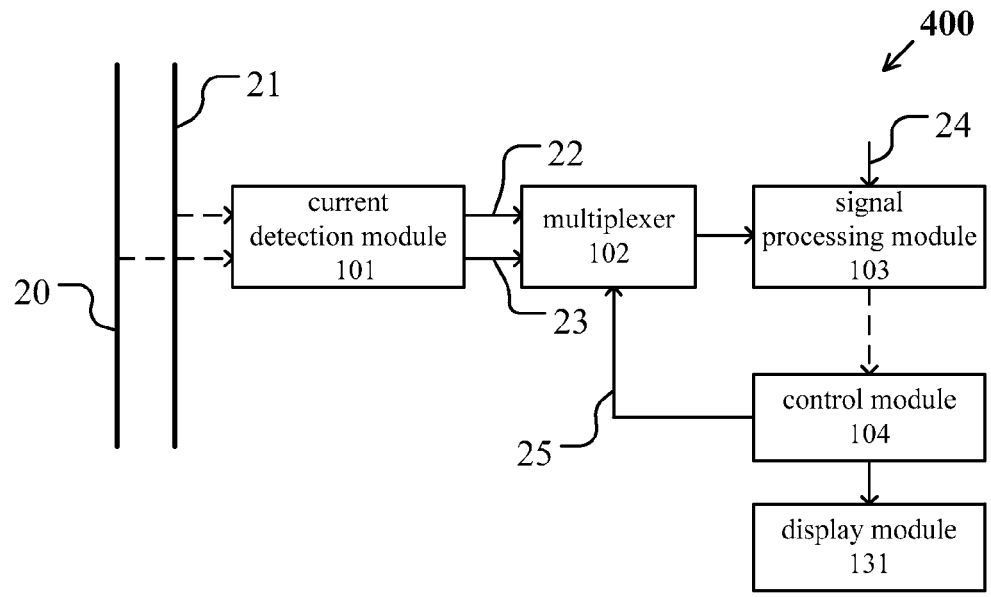
FIG. 4 illustrates an electricity meter according to an embodiment of the present invention that comprises the circuit shown in FIG. 1.

FIG. 4 illustrates an electricity meter 400 according to an embodiment that comprises the circuit 100 shown in FIG. 1.

In FIG. 4, the electricity meter 400 further comprises a display device 131 coupled to the control module 104. The display device 131 is configured to display generated values and/or signals of the circuit 100, such as the effective value of the currents flowing through a first power line 20 and/or a second power line 21.

Figure 5:
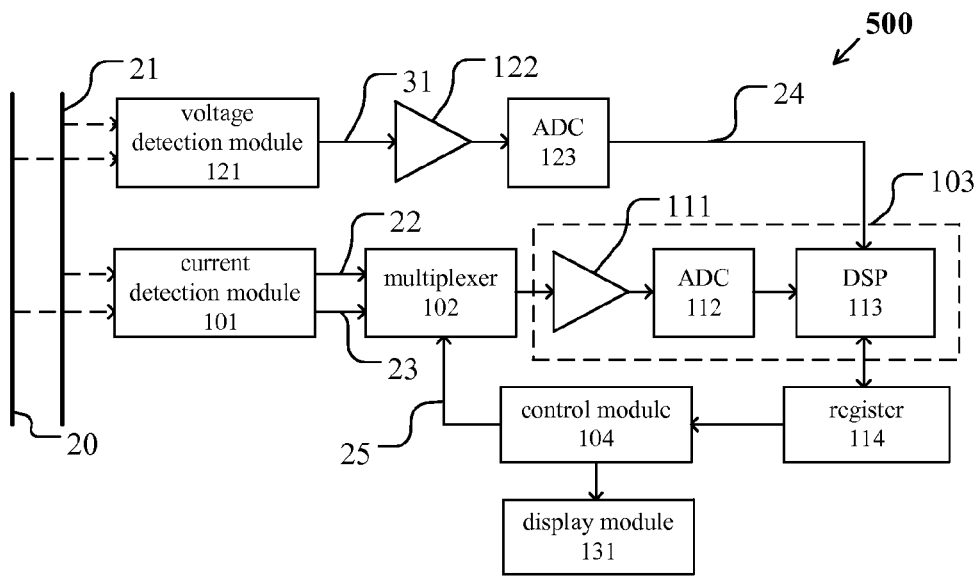
FIG. 5 illustrates an electricity meter according to another embodiment of the present invention that comprises the circuit shown in FIG. 3.

FIG. 5 illustrates an electricity meter 500 according to another embodiment that comprises the circuit 300 shown in FIG. 3.

In FIG. 5, the electricity meter 500 further comprises a display device 131 coupled to the control module 104. The display device 131 is configured to display generated values and/or signals of the circuit 300, such as the effective value of the currents flowing through the first power line 20 and/or the second power line 21.

Figure 6:
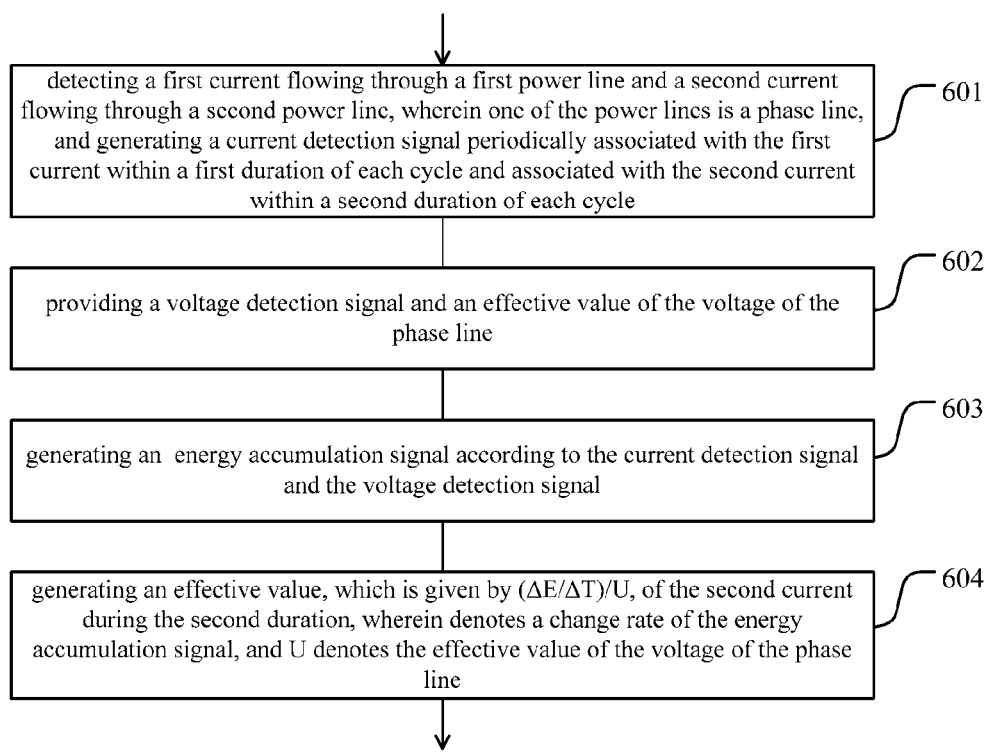
FIG. 6 illustrates a flow chart of a method according to a further embodiment of the present invention.

FIG. 6 illustrates a flow chart of a method according to a further embodiment of the present invention.

As shown in FIG. 6, in step 601, detecting a first current flowing through a first power line and a second current flowing through a second power line, wherein one of the power lines is a phase line, and generating a current detection signal periodically associated with the first current within a first duration of each cycle and associated with the second current within a second duration of each cycle. In an embodiment, the first power line can be a phase line and the second power line can be a neutral line. In another embodiment, the first power line can be a neutral line and the second power line can be a phase line.

In an embodiment, the step 601 is performed by a current detection module having two detection channels and a multiplexer. The multiplexer can switch between the two current detection channels in response to a control signal.

In step 602, providing a voltage detection signal and an effective value of the voltage of a phase line.

In an embodiment, the voltage detection signal is generated by a voltage detection module, and the effective value of the voltage is generated according to the voltage detection signal by a signal processing module, for example, a DSP module.

In step 603, generating an energy accumulation signal according to the current detection signal and a voltage detection signal.

It is appreciated that, the energy accumulation signal can be calculated from the voltage detection signal and the current detection signals, and therefore the energy accumulation signal can substantially follow the change of the voltage detection signal and the current detection signals. According to different algorithms of the calculation, the energy accumulation signal may have a time delay with respect to the voltage detection signal and the current detection signals, for example, one or more cycles of the signal processing. In an embodiment, the energy accumulation signal is generated by a signal processing module, as a definite integration of the product of the current detection signal and the voltage detection signal generated in step 601 and 602.

In step 604, generating an effective value, which is given by $$\frac{\Delta E}{\Delta T \cdot U},$$

of the second current during the second duration, wherein $\Delta E/\Delta T$ denotes a change rate of the energy accumulation signal, and U denotes the effective value of the voltage of the phase line.

In an embodiment, the change rate of the energy accumulation signal is calculated after a first interval since the beginning of the second duration of each cycle. In another embodiment, the change rate of the energy accumulation signal is calculated within a second interval of the second duration after the end of the first interval. For example, after a first interval since the beginning of the second duration, a first value $E_1$ of the energy accumulation signal is recorded. Then, after a second interval since the end of the first interval, a second value $E_2$ of the energy accumulation signal is recorded. Therefore, the change rate of the energy accumulation signal can be given by $(E_1-E_2)/T_0$, wherein $T_0$ denotes the value of the second interval.

In an embodiment, the first power line is the phase line and the second power line is the neutral line. The first current detection signal of the first current can be used to determine the power or energy consumption, while the second current detection signal of the second current can be used to determine whether there is a fault, such as tamper or electric leakage. Therefore, the first duration is generally longer than the second duration. In an embodiment, the second duration is not greater than 400 milliseconds. In another embodiment, the first interval of the second duration is not greater than 100 milliseconds. In a further embodiment, the second interval of the second duration is within a range from 20 milliseconds to 200 milliseconds.

In a preferred embodiment, the method further comprises a step of generating an effective value of the first current according to a value of the first current during the first duration of each cycle.

In the disclosure herein, operations of circuit embodiment(s) may be described with reference to method embodiment(s) for illustrative purposes. However, it should be appreciated that the operations of the circuits and the implementations of the methods in the disclosure may be independent of one another. That is, the disclosed circuit embodiments may operate according to other methods and the disclosed method embodiments may be implemented through other circuits.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
    a current detection module configured to generate a first current detection signal of a first current flowing through a first power line, and a second current detection signal of a second current flowing through a second power line;
    a multiplexer configured to periodically switch between the two current detection signals in response to a control signal, and to output the first current detection signal within a first duration of each cycle of the control signal and output the second current detection signal within a second duration of each cycle of the control signal;
    a signal processing module configured to generate an energy accumulation signal according to an output of the multiplexer and a voltage detection signal of a voltage of the first power line; and
    a control module configured to provide the control signal to the multiplexer, and to generate an effective value of the second current during the second duration which is determined as a function of a change rate of the energy accumulation signal and an effective value of the voltage of the first power line;
    wherein the effective value is given by $$\frac{\Delta E}{\Delta T \cdot U},$$

and wherein $\Delta E/\Delta T$ denotes the change rate of the energy accumulation signal, and U denotes the effective value of the voltage of the first power line.

2. The circuit of claim 1, wherein the change rate of the energy accumulation signal is calculated after a first interval since a beginning of the second duration.

3. The circuit of claim 2, wherein the first interval is not greater than 100 milliseconds.

4. The circuit of claim 1, wherein the change rate of the energy accumulation signal is calculated within a second interval of the second duration after the first interval.

5. The circuit of claim 4, wherein the second interval is within a range from 20 milliseconds to 200 milliseconds.

6. The circuit of claim 1, wherein the second duration is not greater than 400 milliseconds.

7. The circuit of claim 1, further comprising a voltage detection module configured to generate the voltage detection signal with respect to the first power line.

8. The circuit of claim 7, wherein the signal processing module is further configured to generate the effective value of the voltage of the first power line according to the voltage detection signal.

9. The circuit of claim 1, further comprising a register configured to store and provide the energy accumulation signal.

10. The circuit of claim 1, wherein the signal processing module is further configured to directly generate an effective value of the first current according to the first current detection signal during the first duration.

11. The circuit of claim 1, wherein the signal processing module comprises an analog-to-digital converter configured to convert the output of the multiplexer to digital signals.

12. The circuit of claim 1, wherein the first power line is the phase line and the second power line is a neutral line.

13. The circuit of claim 1, wherein the circuit is a component of an electricity meter.

14. The circuit of claim 13, wherein said effective value is indicative of a fault condition, and wherein said first current detection signal is processed to determine an energy consumption value.

15. The circuit of claim 1, further comprising a display device configured to display generated values and/or signals of the circuit.

16. A method comprising:
    detecting with a current detection circuit a first current flowing through a first power line and a second current flowing through a second power line;
    generating a current detection signal periodically associated with the first current within a first duration of each cycle and associated with the second current within a second duration of each cycle;
    providing a voltage detection signal having an effective value of a voltage of the first power line;
    generating using a signal processing circuit an energy accumulation signal according to the current detection signal and the voltage detection signal and an effective value of the second current during the second duration which is determined as a function of a change rate of the energy accumulation signal and the effective value of the voltage of the first power line;
    wherein the effective value is given by $$\frac{\Delta E}{\Delta T \cdot U},$$

wherein $\Delta E/\Delta T$ denotes the change rate of the energy accumulation signal, and U denotes the effective value of the voltage of the first power line.

17. The method of claim 16, wherein the change rate of the energy accumulation signal is calculated after a first interval since a beginning of the second duration.

18. The method of claim 17, wherein the change rate of the energy accumulation signal is calculated within a second interval of the second duration after the first interval.

19. The method of claim 18, wherein the second interval is within a range from 20 milliseconds to 200 milliseconds.

20. The method of claim 17, wherein the first interval is not greater than 100 milliseconds.

21. The method of claim 16, wherein the second duration is not greater than 400 milliseconds.

22. The method of claim 16, further comprising: generating the effective value of the first current according to a value of the first current during the first duration.

23. The method of claim 16, wherein the first power line is a phase line and the second power line is a neutral line.

24. The method of claim 16, wherein said effective value is indicative of a fault condition, and further comprising processing said first current detection signal to determine an energy consumption value.

* * * * *